United States Patent

Hwang

[11] Patent Number: 5,907,501
[45] Date of Patent: May 25, 1999

[54] DATA WRITING AND READING APPARATUS AND METHOD FOR NONVOLATILE ANALOG STORAGE

[75] Inventor: In-Hwan Hwang, Kyungki-do, Rep. of Korea

[73] Assignee: Samsung Electronics, Co., Ltd., Suwon-city, Rep. of Korea

[21] Appl. No.: 08/909,306

[22] Filed: Aug. 11, 1997

[30] Foreign Application Priority Data

Nov. 20, 1996 [KR] Rep. of Korea .................. 96-55723

[51] Int. Cl.⁶ .................................. G11C 27/00
[52] U.S. Cl. .......................... 365/45; 365/189.01
[58] Field of Search ........................ 365/45, 104, 73, 365/185.03, 189.01

[56] References Cited

U.S. PATENT DOCUMENTS

| | | | |
|---|---|---|---|
| 4,890,259 | 12/1989 | Simko | 365/45 |
| 4,989,179 | 1/1991 | Simko | 365/104 |
| 5,388,064 | 2/1995 | Khan | 365/45 |

*Primary Examiner*—David Nelms
*Assistant Examiner*—Thong Le
*Attorney, Agent, or Firm*—Marger, Johnson & McCollom, P.C.

[57] ABSTRACT

A data writing apparatus is disclosed wherein an M-bit data word is converted into an analog data signal using maximum and minimum reference voltages and the analog data signal and the maximum and minimum reference voltages are stored in a nonvolatile memory. One embodiment of the present invention stores the analog data signal in a first nonvolatile memory cell by adjusting a threshold voltage of the memory cell to correspond to the analog data signal and stores the maximum and minimum reference voltages by similarly adjusting the threshold voltages of a second and third nonvolatile memory cell, respectively. A data reading apparatus is shown which reads an analog data signal and maximum and minimum reference voltages from a nonvolatile memory device and converts the analog data signal into an M-bit data word using the maximum and minimum reference voltages.

17 Claims, 3 Drawing Sheets

DATA WRITING AND READING APPARATUS AND METHOD FOR NONVOLATILE ANALOG STORAGE

BACKGROUND OF THE INVENTION

1. Field of the Invention

The present invention relates to a data writing and reading apparatus, and more particularly to a data writing and reading apparatus for splitting N-bit data into M-bit data (where M is equal to or lesser than N), converting the split M-bit data into an analog signal and storing the analog signal in a nonvolatile analog memory.

2. Description of the Related Art

EEPROMs (Electrically Erasable Programmable Read Only Memory) are widely used nonvolatile memory devices. An example of a conventional EEPROM device includes a modified MOS transistor having a floating gate 1 which is electrically insulated from a peripheral element and used as a charge storage gate, as shown in FIG. 1. The EEPROM maintains the state of stored data in the absence of a power source through ion implantation into or ion emission from the floating gate 1. However, since conventional EEPROM devices store data in a digital format, eight EEPROM cells are needed in order to store the eight bits of data that constitute a byte.

An EEPROM cell consists of two transistors, as shown in FIG. 1. One transistor is a memory transistor MEM TR for storing a digital data bit at a logical "1" or "0" state. The other transistor is a select transistor SEL TR for selecting a memory bit. The memory transistor MEM TR has a double layer gate structure consisting of a control gate 2 in an upper gate layer and a floating gate 1 in a lower gate layer, wherein the floating gate 1 is electrically isolated for storing an electron or electrons. The floating gate 1 includes a very thin silicon oxide layer region 3. To implant or emit an electron from the floating gate 1, a high voltage is applied to the silicon oxide layer region 3 in order to induce an F-N current of electrons tunneling through the oxide layer.

In the electron implanting operation involving floating gate 1, which is performed to erase the logical state of the EEPROM cell, a high voltage level, typically 20 volts (V), is applied to the control gate 2 and a select gate 4. A voltage level of 0V is applied to a source electrode 5 and a drain electrode 6. This activates select transistor SEL TR and the voltage level of 0V at the drain electrode 6 is supplied to a source electrode 7, which is an N+ diffusion region positioned underneath thin silicon oxide layer region 3, of the select transistor MEM TR. Since the control gate 2 is at 20V, the F-N current flows to the source electrode 7 from the floating gate 1 and electrons are implanted on floating gate 1. In this manner, electron implantation erases the state of the logic state of the memory cell.

In an electron emitting operation, by which the logic state of the memory cell is programmed, a voltage of 0V is applied to the control gate 2 and a voltage of 20V is applied to the select gate 4 and drain electrode 6. This activates select transistor SEL TR and the voltage level of 20V applied to the drain electrode 6 also appears at the source electrode 7 of the select transistor SEL TR. Since the control gate 2 is at 0V, a high electric field is generated on the floating gate 1 from source electrode 7 which causes electrons to emit from floating gate 1 and tunnel through the thin oxide layer region 3 onto source electrode 7. In this manner, the electrons of floating gate 1 are emitted and the logic state of the memory cell is programmed.

During the write operation, a voltage level of about 5V is applied to the source electrode 5. The reason for this is that if the voltage of the source electrode 5 is 0V, then a potential drop occurs between the source electrode 7 and the drain electrode 6 of 20V and the electric field between control gate 2 and source electrode 7 will be insufficient to obtain the F-N current needed to obtain electron tunneling from floating gate 1. Therefore, a 5V potential is applied to the source electrode 5.

When an electron is implanted on floating gate 1, a threshold voltage of the memory transistor MEM TR is increased. If an electron is emitted from floating gate 1, the threshold voltage of the memory transistor MEM TR is decreased. The difference in the threshold voltage between the implanted (erased) state and the emitted (programmed) state corresponds to a logical "1" or "0" level of the data bit of the memory cell. However, since a conventional EEPROM stores only a logical "1" or "0" level by using a fixed drain voltage, an integrated state of the EEPROM device cannot be stored.

To improve such an integration problem of the memory device, U.S. Pat. No. 4,890,259 entitled "HIGH DENSITY IC ANALOG SIGNAL WRITING AND READING SYSTEM" describes a technique for directly storing an audio signal by using not only logical "1" and "0" levels but also a median level of the drain voltage mapped to an analog data signal instead of applying the fixed drain voltage during the write operation of the memory device, as shown in FIG. 2.

To describe this technique in more detail, an analog audio signal applied to microphone 29 is filtered through input filter 30 into a frequency band which is less than half the signal sample rate of column decoder 26. The filtered audio signal is then applied to column decoder 26 through input amplifier 31 and automatic gain controller (AGC) 32. The analog signal sampled in the column decoder 26 is mapped to a drain voltage for the EEPROM cells of memory array 13 by using a pulse signal provided from a column high voltage generator 21 to an analog column read/write circuit 15 which then writes the analog signal into memory array 13. During a read operation, the analog data stored in memory array 13 is selected by an address output from address sequencer 24 and latched into column address buffer 25 and row address buffer 9 for output to column decoder 26 and row decoder 14, respectively, to produce a time varying analog output signal which is output through output filter 33 and output amplifier 34 to drive a speaker 35.

In the conventional circuit of FIG. 2, the column high voltage generator 21 generates a high voltage pulse signal ranging from 11V to 21V. The analog column read/write circuit 15 receives the high voltage pulse signal output from column high voltage generator 21 and uses the high voltage pulse signal to produce a high voltage data signal which corresponds to the input signal received from AGC 32. The analog column read/write circuit 15 then applies the high voltage data signal to the drain electrode of an EEPROM cell in memory array 13 so that the electric charge stored in the EEPROM cell corresponds to the input signal received from AGC 32. Column read/write circuit 15 reads the data in memory array 13 by comparing the voltage of the drain electrode of the selected EEPROM cell with the high voltage data signal produced from the pulse signal output from the column high voltage generator 21 to produce an analog output signal which is output through output filter 33 and output amplifier to drive speaker 35.

However, the solution of U.S. Pat. No. 4,890,259 is not particularly effective for storing digital data, although it is the first case where a high density IC analog signal writing and reading system has been commercially successful in improving the storage performance of an EEPROM by analog operation.

SUMMARY OF THE INVENTION

It is therefore an object of the present invention to provide for the nonvolatile analog storage of digital data by converting a digital data word into an analog data signal within a range given by maximum and minimum reference voltages and storing the analog data signal and the maximum and minimum reference voltages in a nonvolatile memory device.

One embodiment of the present invention is a data writing apparatus having a reference voltage generator configured to generate a maximum reference voltage signal and a minimum reference voltage signal, a digital to analog converter which receives an M-bit data word and converts the M-bit data word into a corresponding analog data signal within a voltage range given by the maximum and minimum reference voltage signals, and a nonvolatile analog memory which receives and stores the analog data signal and the maximum and minimum reference voltage signals.

Another embodiment of the present invention is a data reading apparatus having a nonvolatile analog memory which stores an analog data signal and maximum and minimum reference voltages and an analog to digital converter which receives the analog data signal from the nonvolatile analog memory and converts the analog data signal into at least one corresponding M-bit data word within a voltage range given by the maximum and minimum reference voltage signals received from the nonvolatile analog memory.

Yet another embodiment of the present invention is a data writing and reading apparatus having a reference voltage generator which generates maximum and minimum reference voltage signals, a digital to analog converter which receives an M-bit data word and converts the M-bit data word into a corresponding analog data signal within a voltage range given by the maximum and minimum reference voltage signals, a nonvolatile analog memory which receives and stores the analog data signal and the maximum and minimum reference voltage signals, and an analog to digital converter which receives the analog data signal read from the nonvolatile analog memory and converts the analog data signal into the corresponding M-bit data word within a voltage range given by the maximum and minimum reference voltage signals received from the nonvolatile analog memory.

An embodiment of a method for nonvolatile storage of data, according to the present invention, includes the steps of converting an M-bit data word into a corresponding analog data signal using maximum and minimum reference voltages to define a voltage range of the analog data signal, and storing the analog data signal and the maximum and minimum reference voltages in a nonvolatile memory device.

BRIEF DESCRIPTION OF THE DRAWINGS

The above objects and other features and advantages of the present invention will become more apparent by describing an embodiment thereof with reference to the accompanying drawings, in which.

DETAILED DESCRIPTION OF PREFERRED EMBODIMENT

Figure 1:
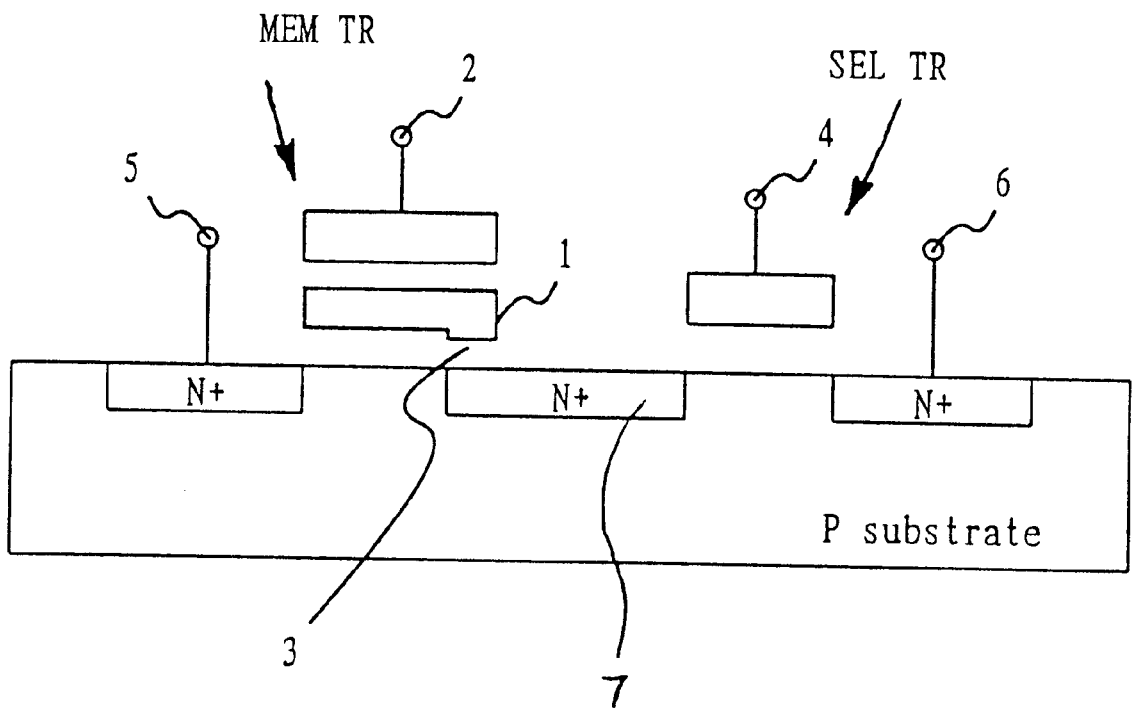
FIG. 1 is a cross-sectional view illustrating a conventional EEPROM cell.
Figure 2:
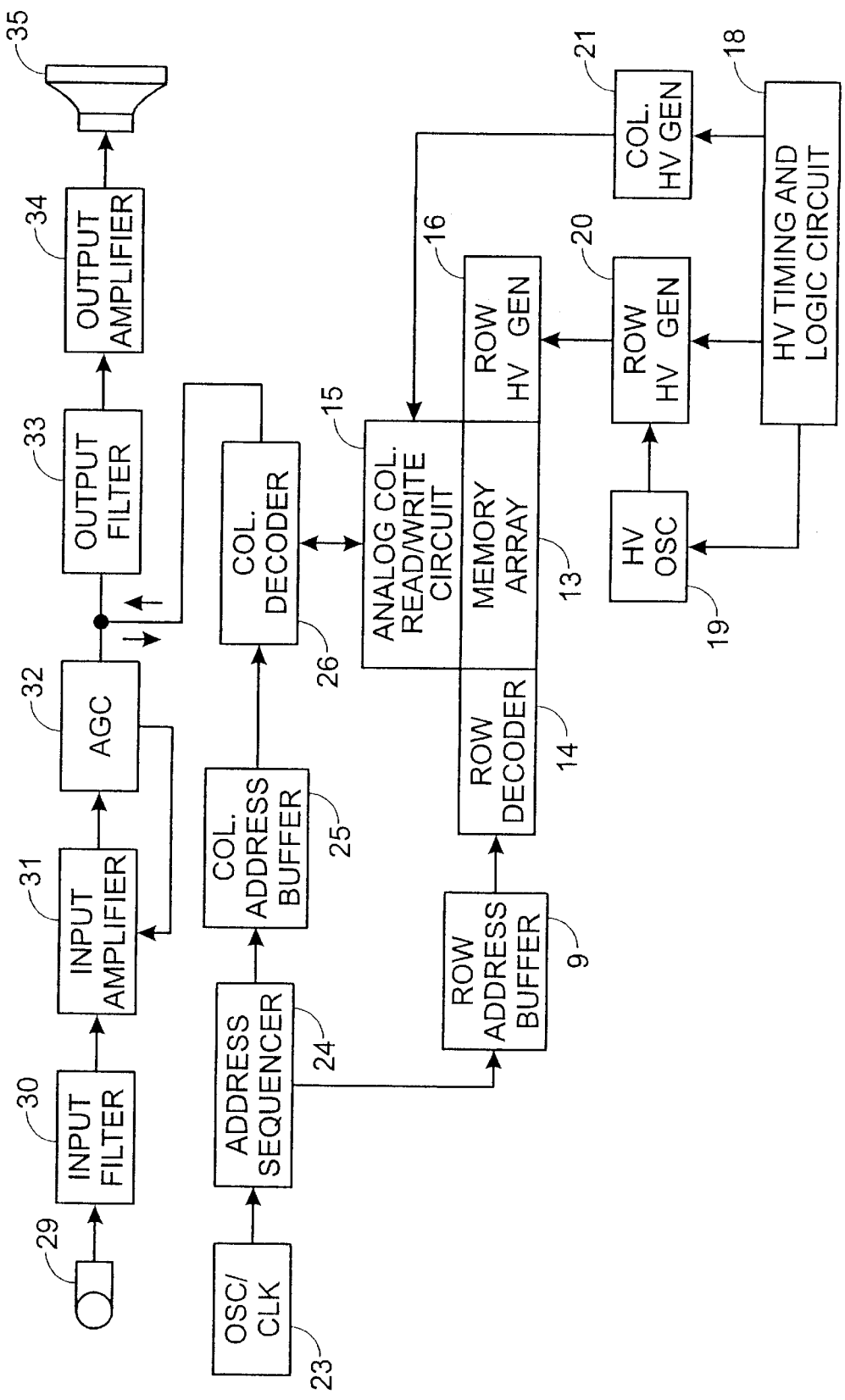
FIG. 2 is a block diagram of a conventional signal writing and reading apparatus using a nonvolatile analog memory composed of the conventional EEPROM cells shown in FIG. 1.
Figure 3:
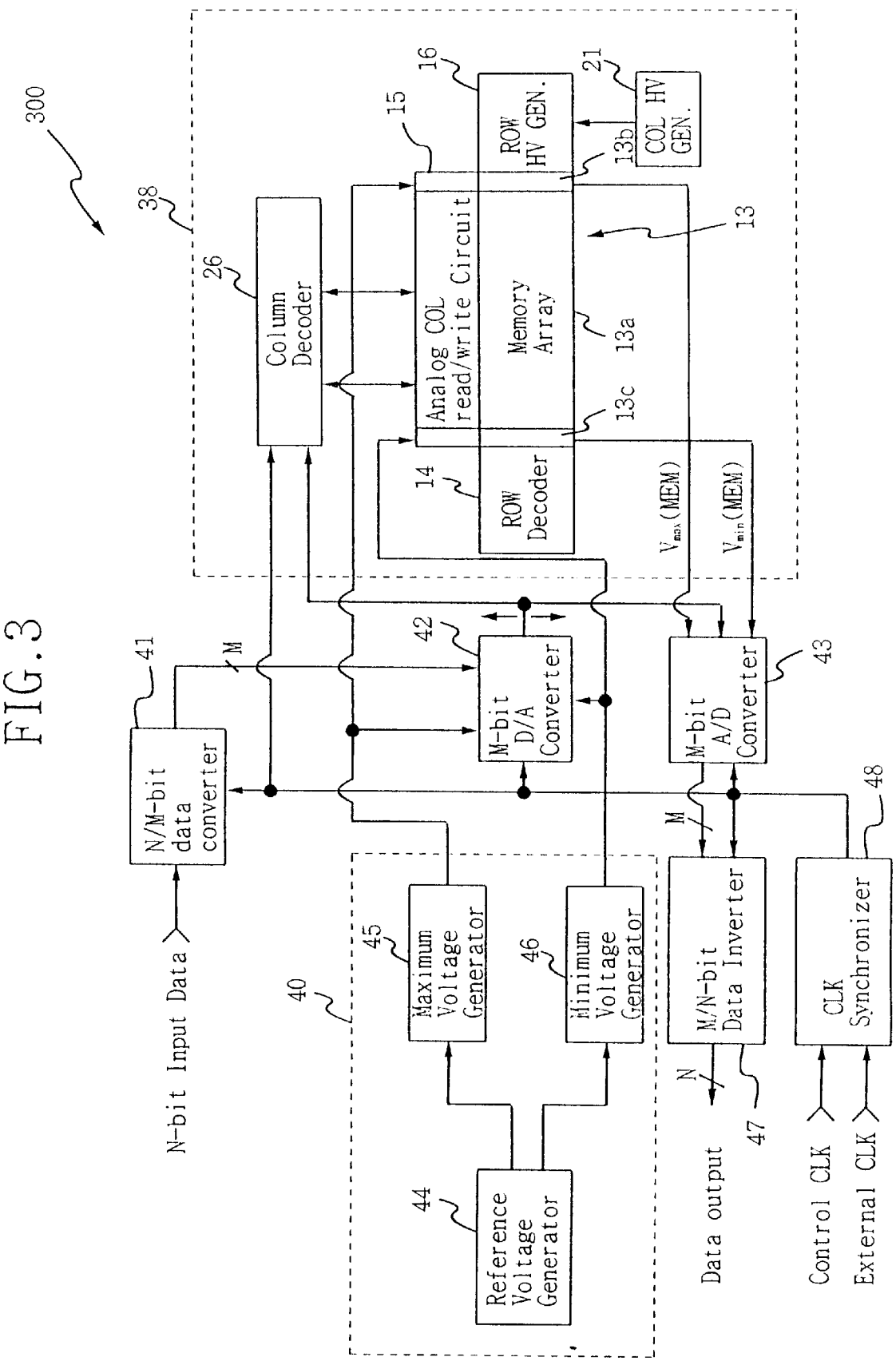
FIG. 3 is a block diagram of an embodiment of a data writing and reading apparatus using a nonvolatile analog memory according to the present invention.

Referring to FIG. 3, a data writing and reading apparatus 300 according to an embodiment of the present invention includes a reference signal generating circuit 40 for generating maximum and minimum reference voltage signals, a data converter 41 for splitting an N-bit data word into at least one M-bit data word (where $M \leq N$ and M is a divisor of N except one), a digital/analog (D/A) converter 42 for converting each M-bit data word into a corresponding analog signal within a voltage range given by the maximum and minimum reference voltage signals, and a nonvolatile analog memory 38 for storing the analog signal and the maximum and minimum reference voltage signals. The data writing and reading apparatus 300 also includes an analog/digital (A/D) converter 43 for converting the analog signal read from the nonvolatile analog memory 38 into corresponding M-bit digital data words within the voltage range given by the maximum and minimum reference voltage signals read from the nonvolatile analog memory 38, and a data converter 47 for generating N-bit digital data words from the M-bit digital data words.

The nonvolatile analog memory 38 includes a memory array 13 for writing the analog signal using a drain voltage which is mapped to the analog signal, an analog column read/write circuit 15, a row high voltage generator 16, a column high voltage generator 21, and column decoder 26 for addressing a column and row decoder 14 for addressing a row of the memory cells in array 13 in order to store the analog signal. The memory cell array 13 is divided into a first region 13a for storing the analog signal, a second region 13b for storing the maximum voltage signal, and a third region 13c for storing the minimum voltage signal.

A clock synchronizer 48 receives a control clock and an external clock and, responsive thereto, supplies a clock signal to the N/M bit data converter 41, the D/A converter 42, the A/D converter 43, the M/N-bit data converter 47, and the column decoder 26.

The reference signal generating circuit 40 includes a reference voltage generator 44, which requires temperature compensation, and maximum and minimum voltage generators 45 and 46 for respectively generating the maximum and minimum voltages Vmax and Vmin by using an output of the reference voltage generator 44.

The N/M-bit data converter 41 splits N-bit digital input data words, typically one byte of eight bits, into M-bit data words which, for example, can be words of two, four or eight bits each. Therefore, when splitting eight bit input data words into two or four bit words, each eight-bit data word is split into either four words of two bits each data words or two words of four bits each, respectively.

The M-bit D/A converter 42 receives the M-bit data words from N/M-bit data converter 41 and generates an analog data signal corresponding to the M-bit data words using the maximum and minimum voltages supplied from the maximum and minimum voltage generators 45 and 46 as reference voltages for the D/A conversion. The analog data signal is then output to column decoder 26 for storage in memory array region 13a. The maximum and minimum voltages used as reference voltages for the D/A conversion process in M-bit D/A converter 42 used to generate the analog data stored in memory array region 13a are simultaneously stored in memory array regions 13b and 13c, respectively.

To reproduce the data stored in memory array region 13a, the analog data signal read from the analog signal storing region 13a by column decoder 26 and analog read/write circuit 15 is input to M-bit A/D converter 43 for conversion into corresponding M-bit data words. At the same time, the maximum and minimum voltages read from the maximum and minimum voltage storing regions 13b and 13c, respectively are input to M-bit A/D converter 43 as the reference voltages used for the A/D conversion process.

The M/N-bit converter 47 receives the M-bit data words output by M-bit A/D converter 43 which were obtained from the analog data stored in the memory cell array region 13a and converts the M-bit data words, i.e. data words of two, four or eight bits each, to the original N-bit data word size. For instance, when combining M-bit data words into N-bit data words, the M/N bit converter 47 generates eight-bit data by combining four words of two data bits each or combining two words of four data bits each.

In order to store eight bits of data in conventional digital format, i.e. one byte, eight EEPROM cells are needed. In the present invention, multiple bits of data, such as two, four or eight bits, can be stored in a single EEPROM cell. Therefore, memory storage area can be reduced by a factor of two, four or eight and data compression is obtained. Thus, for example, two, four or eight times the amount of data can be stored in the same amount of space in analog format when compared to digital format.

However, when storing data in the analog memory, a data retention problem arises because the amount of charge accumulated in the EEPROM cell deteriorates over time. To solve this problem, the maximum and minimum voltages Vmax and Vmin are stored in memory array regions 13b and 13c together with the analog data in memory array region 13a. During the data read operation, the maximum and minimum voltages Vmax and Vmin stored in the memory array regions 13b and 13c are also read, and the analog data signal is converted to a digital signal through the M-bit A/D converter 43 on the basis of the values read for maximum and minimum voltages Vmax and Vmin. The analog data stored in region 13a and the maximum and minimum voltages stored in the regions 13b and 13c will experience the same level of charge deterioration. Thus, even though the charge in the EEPROM cells deteriorates over time, the analog data can be read without error because the corresponding changes in Vmax and Vmin compensate for the charge deterioration of the stored analog data.

As described above, N-bit data words are split into M-bit data words (where M is equal to or smaller than N and M is not equal to 1), the M-bit data words are converted into an analog signal, and the analog signal is stored in the analog memory. Therefore, the digital data can be effectively stored in less memory space. Further, since the maximum and minimum voltages used during the D/A conversion are stored in the memory array together with the analog signal, errors in the analog data due to charge deterioration in the analog memory can be compensated for in the A/D conversion process.

In the drawings and specification, a particular embodiment of the invention has been disclosed and although specific terms are employed they are used in a generic and descriptive sense only and not for purposes of limitation, the scope of the invention being set forth in the following claims.

What is claimed is:

1. A data writing apparatus comprising:
   a reference voltage generator configured to generate a maximum reference voltage signal and a minimum reference voltage signal;
   a digital to analog converter configured to receive an M-bit data word and convert the M-bit data word into a corresponding analog data signal within a voltage range given by the maximum and minimum reference voltage signals; and
   a nonvolatile analog memory configured to receive and store the analog data signal and the maximum and minimum reference voltage signals.

2. A data writing apparatus comprising:
   a reference voltage generator configured to generate a maximum reference voltage signal and a minimum reference voltage signal;
   a digital to analog converter configured to receive an M-bit data word and convert the M-bit data word into a corresponding analog data signal within a voltage range given by the maximum and minimum reference voltage signals;
   a nonvolatile analog memory configured to receive and store the analog data signal and the maximum and minimum reference voltage signals; and
   a data converter configured to receive N-bit data words and split each N-bit data into at least one M-bit data word, where $M \leq N$, $M > 1$ and M is an integer divisor of N.

3. A data writing apparatus as claimed in claim 2, wherein N is a multiple of 8 and M is an integer divisor of N.

4. A data reading apparatus comprising:
   a nonvolatile analog memory configured to store an analog data signal and maximum and minimum reference voltages; and
   an analog to digital converter configured to receive the analog data signal from the nonvolatile analog memory and convert the analog data signal into at least one corresponding M-bit data word within a voltage range given by the maximum and minimum reference voltage signals received from the nonvolatile analog memory.

5. The data reading apparatus of claim 4, further comprising:
   a data converter configured to receive the M-bit data words generated by the analog to digital converter and, responsive thereto, generate an N-bit data word, where $M \leq N$, $M > 1$ and M is an integer divisor of N.

6. The data read apparatus of claim 5, wherein N is a multiple of 8 and M is an integer divisor of N.

7. A data writing and reading apparatus comprising:
   a reference voltage generator configured to generate maximum and minimum reference voltage signals;
   a digital to analog converter configured to receive an M-bit data word and convert the M-bit data word into a corresponding analog data signal within a voltage range given by the maximum and minimum reference voltage signals;
   a nonvolatile analog memory configured to receive and store the analog data signal and the maximum and minimum reference voltage signals; and
   an analog to digital converter configured to receive the analog data signal read from the nonvolatile analog memory and convert the analog data signal to the corresponding M-bit data word within a voltage range given by the maximum and minimum reference voltage signals received from the nonvolatile analog memory.

8. The data writing and reading apparatus of claim 7, further comprising:
   a first data converter configured to receive an N-bit data word and split the N-bit data word into at least one M-bit data word, where M≦N, M>1 and M is an integer divisor of N, and output the at least one M-bit data word to the digital to analog converter; and a second data converter configured to receive the M-bit data words generated by the analog to digital converter and convert the M-bit data words received into N-bit data words.

9. A data writing and reading apparatus as claimed in claim 8, wherein N is a multiple of 8 and M is an integer divisor of N.

10. A method for nonvolatile storage of data, the method comprising the steps:

converting an M-bit data word into a corresponding analog data signal using maximum and minimum reference voltages to define a voltage range of the analog data signal; and storing the analog data signal and the maximum and minimum reference voltages in a nonvolatile memory device.

11. The method of claim 10, wherein the step of storing the analog data signal and the maximum and minimum reference voltages in a nonvolatile memory device includes the steps:

applying a low voltage potential to a control gate of a first nonvolatile memory cell;

comparing a threshold voltage of the first nonvolatile memory cell to the analog data signal to determine if the threshold voltage of the first nonvolatile memory cell corresponds to the analog data signal; and applying a high voltage pulse to a select gate and a drain electrode of the nonvolatile memory cell if the threshold voltage of the first nonvolatile memory cell does not correspond to the analog data signal.

12. The method of claim 11, wherein the step of storing the analog data signal and the maximum and minimum reference voltages in a nonvolatile memory device further includes the steps:

applying a low voltage potential to a control gate of a second nonvolatile memory cell;

comparing a threshold voltage of the second nonvolatile memory cell to the maximum reference voltage to determine if the threshold voltage of the second nonvolatile memory cell corresponds to the maximum reference voltage; and applying a high voltage pulse to a select gate and a drain electrode of the second nonvolatile memory cell if the threshold voltage of the second nonvolatile memory cell does not correspond to the maximum reference voltage.

13. The method of claim 12, wherein the step of storing the analog data signal and the maximum and minimum reference voltages in a nonvolatile memory device further includes the steps:

applying a low voltage potential to a control gate of a third nonvolatile memory cell;

comparing a threshold voltage of the third nonvolatile memory cell to the minimum reference voltage to determine if the threshold voltage of the third nonvolatile memory cell corresponds to the minimum reference voltage; and applying a high voltage pulse to a select gate and a drain electrode of the nonvolatile memory cell if the threshold voltage of the third nonvolatile memory cell does not correspond to the minimum reference voltage.

14. The method of claim 10, further including the steps:

reading the analog data signal and the maximum and minimum reference voltages from the nonvolatile memory device; and converting the analog data signal to the corresponding M-bit data word using the maximum and minimum reference voltages to define the voltage range of the analog data signal.

15. The method of claim 14, wherein the step of reading the analog data signal and the maximum and minimum reference voltages from the nonvolatile memory device includes the steps:

selecting the first nonvolatile memory cell to obtain the analog data signal;

selecting the second nonvolatile memory cell to obtain the maximum reference voltage; and selecting the third nonvolatile memory cell to obtain the minimum reference voltage.

16. The method of claim 10, including the step of splitting an N-bit data word into multiple M-bit data words, where M≦N, M>1 and M is an integer divisor of N.

17. The method of claim 14, including the step of combining multiple M-bit data words into an N-bit data word, where M≦N, M>1 and M is an integer divisor of N.

* * * * *